United States Patent [19]

Reed

[11] Patent Number: 4,897,555

[45] Date of Patent: Jan. 30, 1990

[54] CURRENT SPLIT CIRCUIT HAVING A DIGITAL TO ANALOG CONVERTER

[75] Inventor: Eric L. Reed, St. Paul, Minn.

[73] Assignee: Minnesota Mining and Manufacturing Company, St. Paul, Minn.

[21] Appl. No.: 276,101

[22] Filed: Nov. 23, 1988

[51] Int. Cl.[4] .......................... H02J 1/14; H03M 1/66

[52] U.S. Cl. .......................................... 307/32; 307/55; 341/144

[58] Field of Search ........................ 341/135, 154, 144; 307/31, 32, 38, 52, 55

[56] References Cited

U.S. PATENT DOCUMENTS 3,474,440 4/1966 Schmid ................................ 341/135

3,815,123 6/1974 Howard, Jr. et al. .............. 341/154

3,943,431 3/1976 Hareyama ............................ 307/32

FOREIGN PATENT DOCUMENTS 0111124 7/1982 Japan .

*Primary Examiner*—William M. Shoop, Jr.
*Assistant Examiner*—Helen Kim
*Attorney, Agent, or Firm*—Donald M. Sell; Walter N. Kirn; Robert L. Marben

[57] ABSTRACT

A current split circuit that includes a multiplying digital to analog converter (DAC) and a controller. The controller establishes a first and second terminal of the DAC at the same potential so that a digital input to the DAC determines the ratio by which a current at a third terminal of the DAC is split between the first and second terminals of the DAC.

5 Claims, 2 Drawing Sheets

CURRENT SPLIT CIRCUIT HAVING A DIGITAL TO ANALOG CONVERTER

FIELD OF THE INVENTION

The invention presented herein relates to current split or current division circuits and in particular to precision logic controlled current split circuits using a multiplying digital to analog converter (DAC).

BACKGROUND OF THE INVENTION

There is a need in electronic measurement and control equipment for a precision logic controlled current split or current division circuit that provides an accurate adjustment of the relative magnitude of two currents. Current split, for example, is used in nulled-bridge type circuits, but manual adjustment is used for the current split. Other prior art circuits provided a current split of fixed magnitudes. Such known current split circuits are also not of a form that would make automatic adjustment of the amount of current split between two circuit paths readily attainable.

Programmable current source circuits are also known which use a digital to analog converter (DAC) with an operational amplifier and semiconductor switch to provide a precision single output current from a precision input voltage. Such use of a DAC is explained in a publication entitled "CMOS DAC Application Guide", Second Edition, 1984, by Phil Burton, which is available from Analog Devices, Inc. The publication does not, however, contain any current split circuits nor does it teach how any of the circuits disclosed in the publication can be modified to provide a current split circuit using a DAC.

SUMMARY OF THE INVENTION

The invention presented herein provides a current split circuit that includes a digital to analog converter (DAC) to which a digital input can be applied for determining the ratio by which a current is split to provide the current flow for two circuit loops and wherein the circuit loops have a common power source and separate loads. A multiplying DAC is used which has first, second and third terminals with the desired split currents presented at the first and second terminals provided they are at the same potential. The sum of the split currents is presented at the third terminal. The second terminal provides for connection of the DAC to one of the loads of the two circuit loops. A controller is included which serves to establish the first and second terminals at the same potential. The controller includes an operational amplifier that has two input terminals, one of which is connected to the first terminal of the DAC. The operations amplifier also has a negative feedback semiconductor linear circuit (NFSLC)loop connected between the one input terminal of the amplifier and the amplifier output terminal. The other input terminal of the amplifier is connected to the second terminal of the DAC. The NFSLC has a terminal which provides for connection of the current split circuit to the other load of the two circuit loops. The NFSLC is also operatively connected to the output of the operational amplifier.

It is possible that the circuit loop connected to the aforementioned terminal of the NFSLC may present a voltage having a polarity that would prevent the NFSLC from conducting. The NFSLC includes a controlled semiconductor linear device (CSLD) plus a series connected constant reference voltage source (CRVS). The CRVS is connected between the CSLD and the first terminal of the DAC. The CRVS being presented in series with the CSLD assures conduction of the CSLD so long as the voltage of the CRVS is not opposed by a larger voltage at the terminal of the CSLD that is connected to the other load of the two circuit loops, thus allowing bipolar voltages to be present at such terminal of the CSLD. Bipolar voltages can appear where the current splitter circuit is used in a null-bridge circuit application.

The current split circuit embodying the invention can be configured as a sourcing current splitter, wherein current flow is away from the DAC at its first and second terminals, or can be configured as a sinking current splitter, wherein the current flow is toward the DAC at its first and second terminals.

Use of the current split circuit is illustrated by its connection as a part of two circuit loops wherein part of the split current passes via a load in one loop and with the remainder of the total current passing via a load in the other loop with the two loops having a common power source.

BRIEF DESCRIPTION OF THE DRAWINGS

The features of the invention presented herein, which are referred to above and others, will become more apparent to those skilled in the art upon consideration of the following detailed description which refers to the accompanying drawings wherein.

DETAILED DESCRIPTION

Figure 1:
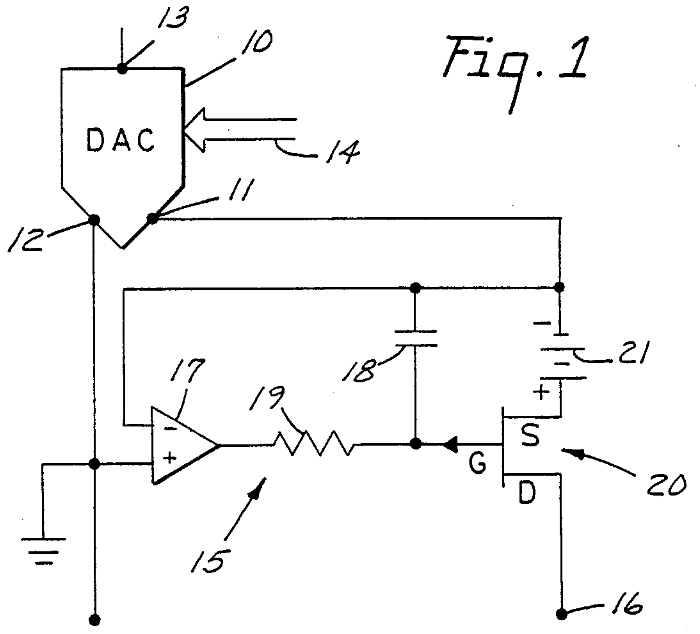
FIG. 1 is a schematic of a sourcing current split circuit embodying the invention.
Figure 2:
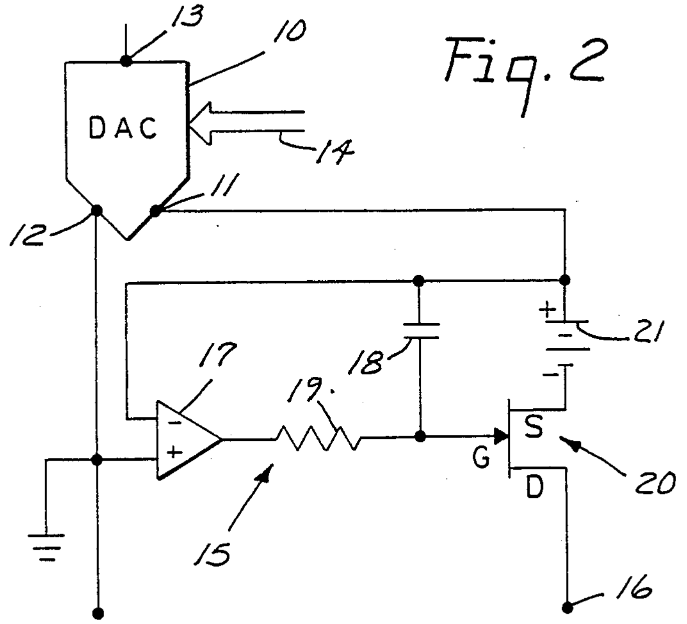
FIG. 2 is a schematic of a sinking current split circuit embodying the invention.

Referring to the circuits of FIGS. 1 and 2 of the drawing, which embody the invention presented herein, each includes a digital to analog converter (DAC) 10. Before consideration is given other portions of the circuits, the functioning of the DAC will be considered. DAC's usable in the circuitry of FIGS. 1 and 2 are multiplying DAC's, which are well known and are commercially available. The DAC used in FIGS. 1 and 2 is an N-bit CMOS DAC based on an R-2R resistive ladder network. The R-2R ladder divides the current that is present at terminal 13 (generally referred to as the $V_{ref}$ pin of a DAC) into binary weighted currents which are steered by current steering switches relative to terminal 12 (generally referred to as the Out 2 pin of a DAC), which is at DAC power supply ground potential. The digital input to the digital input port 14 of the DAC determines the position of the current steering switches, one switch for each digital input line, with a logic "1" causing the switch to steer current via the terminal 11 and a logic "0" causing the switch to steer current via the terminal 12. The fraction of the current that is steered by a current steering switch is weighted in accordance with the value of the binary input directed to a particular current steering switch. Thus, if the digital input for a 8-bit CMOS DAC was all "0's", all of the current flow would be via terminal 12, while a digital input of "10000000" causes half of the current to flow via terminal 12 and the remainder via terminal 11. Further, if the input is "11111111", then only 1/256 of the current at terminal 13 flows via the grounded-terminal 12. The sum of the currents at terminals 11 and 12 is the same for all digital inputs. Such functioning of the CMOS DAC is possible only if the terminals 11 and 12 are at the same potential and furthermore are at zero-volts relative to the power supply input voltages supplied to the DAC (not shown). The standard method of holding terminals 11 and 12 at ground is to use an external operational amplifier that is connected as a current to voltage converter providing feedback current to the RFB terminal (not shown) of the DAC. This is not done in the circuitry of FIGS. 1 and 2. If the RFB terminal of the DAC were used in the usual manner, the accuracy of the current at terminal 11 would not be preserved, but would be converted into a voltage output variable.

The DAC, if it is a four quadrant multiplying DAC, is operable for current flow either to or away from terminal 13, allowing the circuitry of the present invention to have a sourcing or sinking current configuration. A sourcing current configuration is shown in FIG. 1, wherein the currents flow away from terminals 11 and 12, while FIG. 2 shows a sinking current configuration wherein the currents flow toward terminals 11 and 12. Some two quadrant multiplying DACs are usable but only in the sinking current configuration.

The remainder of the circuitry shown in FIGS. 1 and 2, which will be referred to as a controller 15, functions to force a null or virtual ground at terminal 11 with respect to grounded terminal 12. It includes an operational amplifier 17 with a negative feedback semiconductor linear circuit (NFSLC). The controller 15 serves also to preserve the accuracy of the current at terminal 11 as a measurement variable. The controller 15 has a constant reference voltage source (CRVS) 21 as a part of the NFSLC that allows bipolar voltages to be presented at its terminal 16. The controller 15 preserves the accuracy of the current at terminal 11 as a measurement variable by passing this same current on through the constant reference voltage source (CRVS) 21 and a controllable semiconductor linear device (CSLD)20, which is also a part of the NFSLC, such that only minor errors in this split current through the DAC terminal 11 are conducted through the control terminal of CSLD 20. As has been noted, the DAC 10 can operate with either polarity of current while the controller 15 is inherently a unipolar circuit that can be configured for one polarity or the other, which accounts for the differences in the controller 15 in FIGS. 1 and 2. The NFSLC includes a capacitor 18 and resistor 19 for stabilization of the internal closed loop that includes the operational amplifier 17, the CSLD 20 and the CRVS 21. The capacitor 18 is connected in series with the resistor 19 with such series circuit connected between the inverting input and the output of the operational amplifier 17 with resistor 19 connected to the output of the operational amplifier. A suitable CSLD device 20 which operates as a controllable linear voltage dependent resistor, can be provided, in the case of FIG. 1, by a P-channel MOSFET or JFET or a PNP bipolar transistor or PNP Darlington amplifier. In the case of FIG. 2, the CSLD 20 can be provided by a N-channel MOSFET or JFET or a NPN bipolar transistor or NPN Darlington amplifier. For example, FIG. 1 is shown using a P-channel JFET with its gate connected to the connection common to the resistor 19 and capacitor 18 and its source connected to the positive side of the CRVS 21. The drain of the JFET 20 is connected to terminal 16 of the current splitting circuitry. The inverting input of operational amplifier 17 and the negative side of the CRVS 21 are connected to terminal 11 of DAC 10. The controller 15 of FIG. 1 causes current flow away from DAC terminal 12 making the circuit a sourcing version of the current splitting circuit.

Referring to FIG. 2, the same reference numerals, as are used in FIG. 1, are used to identify the same or similar elements in FIG. 2. The controller 15 of FIG. 2 is shown using an N-channel JFET for the CSLD 20 and the CRVS 21 polarity is reversed with respect to that shown in FIG. 1. The controller 15 of FIG. 2 causes current flow toward DAC terminal 12 making the circuitry of FIG. 2 a sinking version of the current splitting circuit.

Figure 3:
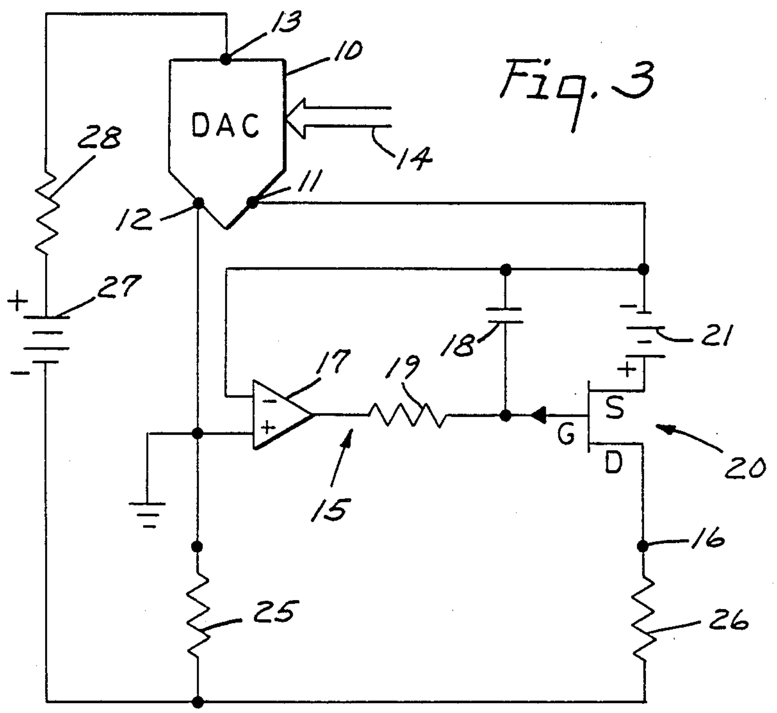
FIG. 3 is an illustration of the use of the circuit of FIG. 1.

As mentioned above, it is the function of the controller 15 to force terminal 11 to be at the same potential as terminal 12 permitting the circuit in FIGS. 1 and 2 to be used as current splitter circuits wherein the digital input at 14 of the DAC 10 determines the amount of current split between the current at terminal 11 and terminal 12. This "forced null" between terminals 11 and 12 is provided by the action of the NFSLC of the controller 15. Explanation of such functioning of the controller 15 will be made in relation to FIG. 3 wherein the circuit of FIG. 1 is used with loads represented by resistor 25 connected at one end to terminal 12 of DAC 10 and resistor 26 connected to terminal 16. The opposite ends of resistors 25 and 26 are connected to the negative side of a D.C. source 27 which has its positive side connected to terminal 13 of DAC 10 via a resistor 28. For purposes of the explanation to be provided regarding the "forced null" action, the CSLD 20 will be considered to be a P-channel JFET as shown in FIG. 3. Other assumptions include the use of a CRVS 21 of 10 volts, a 60 volt D.C. source 27, a 100K ohm resistor for resistor 28, and 300 ohm and 100 ohm resistors for resistors 25 and 26, respectively. The DAC 10 is assumed to be an 8-bit DAC. The supply voltages (not shown) for the operational amplifier 17 are a positive voltage of about +20 volts and a negative voltage of about −5 volts.

Assume the output of the operational amplifier 17 in FIG. 3 is at zero volts due to a prior condition, when no currents flowed through the DAC 10 and the voltage between terminals 11 and 12 is then zero. When a digital input of 10000000 is then applied to the input 14 of the 8-bit DAC, the DAC internal resistance between terminal 11 and 13 and between 12 and 13 will be the same. Currents flow from terminals 11 and 12 with the JFET 20 conducting at a level such that a "forced null" condition does not exist initially. A negative voltage signal will be presented to the inverting input of operational amplifier 17 which, after a short lag time, causes a positive voltage to be presented at the output of the operational amplifier reducing the source to gate voltage of the JFET 20 causing it to be less conductive. This results in an increase in the source to drain voltage of the JFET 20 to a higher positive value causing the magnitude of the inverting input of the operational amplifier 17 to be reduced, which, after a short lag time, causes an increase in a positive direction of the output of the operational amplifier. The source to gate voltage of the FET 20 is thereby increased to further reduce the level of conduction of the JFET causing the source to drain voltage of the JFET to increase, thereby further reducing the magnitude of the inverting input to the operational amplifier. In this manner, the voltage input to the operation amplifier will be reduced to zero and in this sense, the feedback circuit portion is considered as functioning to produce a "forced null" at the inputs to the operational amplifier 17.

As can be seen in FIG. 3, the circuitry of FIG. 1 is used as a part of two circuit loops wherein the one loop includes the load represented by resistor 25, power source 27, resistor 28 and DAC 10 with the other loop being established by the load represented by the resistor 26, power source 27, resistor 28, DAC 10 and a portion of the controller 15.

As described earlier, the digital input at 14 determines the relative magnitude of the current at terminals 11 and 12, wherein the total of these currents remain the same provided the voltages at terminals 11 and 12 are the same. As indicated earlier, if the digital input to an 8-bit DAC was "00000000", then all of the DAC internal switches direct the input current, $I_{13}$, at terminal 13 to the grounded terminal 12 such that the current at terminal 11, $I_{11}$, is zero and all current through the DAC passes through terminal 12 as current $I_{12}$. It was also indicated if the digital input were "11111111", only 1/256 of the current through the DAC passes through the grounded terminal 12. Similarly, a digital input of "10000000" causes an equal split of the current between terminals 11 and 12. Consider the decimal value, D, for the two digital inputs "11111111" and "10000000", D=255 and 128 respectively. For D=255, the currents can be expressed mathematically as follows:

$$I_{11} = \frac{255}{256} I_{13} = \frac{255}{256}(I_{11} + I_{12})$$

and for D=128

$$I_{11} = \frac{128}{256} I_{13} = \frac{128}{256}(I_{11} + I_{12})$$

"256" is the decimal representation of $2^8$, where "8" is the number of bits of resolution of the DAC example. Using this information, the above equations for $I_{11}$ can be expressed in more general terms as follows:

$$I_{11} = \frac{D}{2^N}(I_{11} + I_{12}) \text{ or}$$

$$\frac{D}{2^N} = \frac{I_{11}}{I_{11} + I_{12}};$$

where N is the number of bits for the DAC. Accordingly, a desired ratio by which the current through the DAC is split is readily obtained by selection of the digital input to the DAC since the total current through the DAC remains unchanged. The controller 15 then functions to force a null at terminals 11 and 12 which is needed to have the total current remain unchanged independent of the split in the current that is selected by the digital input.

Figure 4:
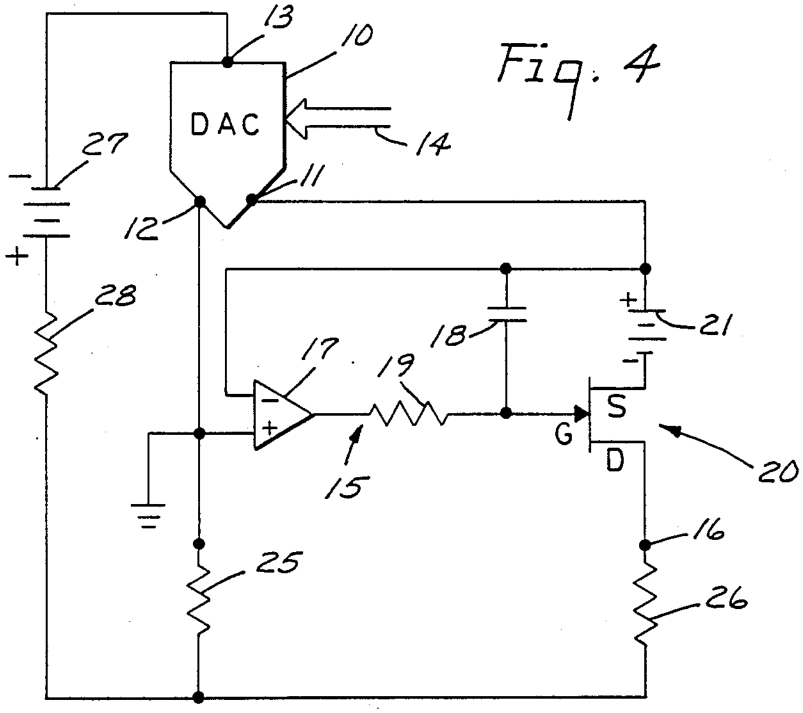
FIG. 4 is an illustration of the use of the circuit of FIG. 2.

An application of the current split circuit in a null-bridge configuration can be shown to permit the determination of an unknown resistance when the value of another circuit resistance is of a known value. FIGS. 3 or 4 can be used as examples of this type of application wherein either resistors 25 or 26 is of a known value and the other is of an unknown value. For the case where resistor 26 is unknown, its value can be determined by monitoring the voltage at terminals 12 and 16 as the digital input to the DAC 10 is changed in a controlled manner until the same voltages are present at terminal 12 and 16. At such time $V_{12}=V_{16}$; $I_{11}=I_{16}$ and $I_{12}R_{25}=I_{11}R_{26}$. Then, $$\frac{I_{11}}{I_{11} + I_{12}} = \frac{R_{25}}{R_{25} + R_{26}}$$

From the earlier explanation given, it is also known that $$\frac{D}{2^N} = \frac{I_{11}}{I_{11} + I_{12}},$$

so that $$\frac{D}{2^N} = \frac{R_{25}}{R_{25} + R_{26}}.$$

Solving the last equation for $R_{26}$:

$$\text{Then, } R_{26} = R_{25}\left(\frac{2^N - D}{D}\right)$$

With everything known on the right hand side of the last equation, the value for $R_{26}$ can be calculated.

Referring to FIG. 4, the circuit of FIG. 2 is shown connected for use in a manner similar to the use of FIG. 1 in FIG. 3. The differences between FIGS. 1 and 2 have already been noted. FIG. 4 is shown using the same resistors 25 and 26 for loads. The D.C. power source 27 and resistor 28 of FIG. 2 is also used, but the polarity of the power source 27 is reversed since the circuit of FIG. 2 is a sinking current split circuit. In addition, the magnitudes of the D.C. supply voltages (not shown) for the operational amplifier are transposed, i.e., the positive supply voltage must be greater in magnitude than the negative supply voltage since the output of the operational amplifier 17 must provide a gate to source voltage for the N channel type JFET 20 and the CRVS 21 to reduce the drain current of the JFET to zero. The "forced null" operation of the circuitry of FIG. 4 can be explained in a similar manner as was done for the circuitry of FIG. 3.

As can be appreciated from the foregoing description the invention presented herein provides a current split circuit that permits a digital to analog converter (DAC) to be utilized which allows the ratio of the split currents to be readily changed using the digital input to the DAC allowing the current split circuit to be controlled via digital control circuitry such as a microcomputer or computer. The utilization of a DAC in this manner is attained by the use of the controller that has been described which provides the further advantage of allowing the current split circuit to be used without regard to the polarity of a voltage that may be present at the loads that can be connected to the controller of the current split circuit.

The particulars of the foregoing description are provided merely for purposes of illustration and are subject to a considerable latitude of modification without departing from the novel teachings disclosed therein. Accordingly, the scope of this invention is intended to be limited only as defined in the appended claims, which should be accorded a breadth of interpretation consistent with this specification.

I claim:

1. A current split circuit connectable as a part of two circuit loops for providing a selectable ratio of current split between the two circuit loops, the circuit loops having a common power source and separate loads, the current split circuit including:

a multiplying digital to analog converter (DAC) for receiving a digital input which determines the ratio of the current split, said DAC having first, second and third terminals plus a digital input, the current at said first and second terminals being in accordance with the ratio of the current split provided said first and second terminals are at the same potential, the sum of the split currents being present at said third terminal of said DAC, said second terminal providing for connection of said DAC to one of the loads of the two circuit loops with said third terminal providing for connection of said DAC with the common power source; and a controller circuit portion for establishing said first and second terminals of said DAC at the same potential having (1) an operational amplifier with two input terminals and an output terminal, one of said input terminals operatively connected to said first terminal of said DAC and the other of said two input terminals connected to said second terminal of said DAC; and (2) a negative feedback semiconductor linear circuit (NFSLC) operatively connected between said output terminal of said operational amplifier and said first terminal of said DAC, said NFSLC having a terminal conducting the current at said first terminal of said DAC, said terminal of said NFSLC providing for connection of the current split circuit to the other load of the two circuit loops.

2. A current split circuit according to claim 1 wherein said NFSLC includes a controlled semiconductor linear device (CSLD) and a series connected constant reference voltage source (CRVS), said CRVS connected between one electrode of said CSLD and said one terminal of said DAC, said CSLD having a control electrode operatively connected to said output terminal of said operational amplifier and having another electrode connected to said terminal of said NFSLC.

3. A current split circuit according to claim 2 wherein current flow into the DAC is provided at said third terminal with current flow at said first and second terminals being away from said DAC, said CSLD providing for the conduction of current at said first terminal of said DAC from said first terminal to said terminal of said NFSLC and said CRVS having its negative terminal connected to said first terminal of said DAC.

4. A current split circuit according to claim 2 wherein current flow out of the DAC is provided at said third terminal with current flow at said first and second terminals being into said DAC and said CSLD providing for the conduction of current at said first terminal of said DAC from said CRVS which is connected to connect its positive terminal to said first terminal of said DAC.

5. A current split circuit according to claim 2 wherein said CRVS is connected for current flow in the same direction that current is to flow between said first terminal of said DAC and said CSLD when the current split circuit is connected as a part of the two circuit loops whereby said controller circuit portion will operate independent of a voltage that may be present at said terminal of said NFSLC that is of a polarity opposite to and of a magnitude less than the magnitude of said CRVS.

* * * * *